United States Patent [19]

Ogawa

[11] Patent Number: 4,983,103
[45] Date of Patent: Jan. 8, 1991

[54] ANNULAR PLUNGER PUMP
[75] Inventor: Kenji Ogawa, Musashino, Japan
[73] Assignee: Neuberg Company Limited, Japan
[21] Appl. No.: 394,034
[22] Filed: Aug. 15, 1989
[30] Foreign Application Priority Data Aug. 16, 1988 [JP] Japan .................................. 63-204515
Mar. 1, 1989 [JP] Japan .................................. 1-48960

[51] Int. Cl.$^5$ .......................... F04B 17/00; B67D 1/08
[52] U.S. Cl. ..................................... 417/400; 417/401;
222/148; 222/334
[58] Field of Search ............... 417/400, 401, 393, 394;
222/146.2, 146.5, 149, 334, 148

[56]  References Cited
U.S. PATENT DOCUMENTS

4,334,833  6/1982  Gozzi .................................. 417/469
4,840,548  6/1989  Hammelmann ..................... 417/469

Primary Examiner—Leonard E. Smith
Assistant Examiner—John A. Savio, III
Attorney, Agent, or Firm—Lowe, Price, LeBlanc, Becker & Shur

[57] ABSTRACT

A pump is adapted for discharging a very small quantity of a liquid and has a discharge port opening and shut valve, discharge element and liquid drawing passageway opening and shut valve. The discharge port opening and shut valve includes a rod-shaped element which can advance to and retract away from a discharge port. The tubular discharge element and opening and shut valves mate relatively movably with each other coaxially with the rod-shaped element on the cylindrical surface of the red-shaped element. The advancement of the discharge element discharges the liquid which has been introduced into the liquid drawing passageway and regulated by the opening and shut valves to a predetermined amount.

6 Claims, 5 Drawing Sheets

ANNULAR PLUNGER PUMP

BACKGROUND OF THE INVENTION

1. Field of the Invention

The present invention relates to a pump discharging a very small quantity of a liquid and is applicable to delivery pumps for a soldering paste, a solvent such as alcohol and an adhesive.

2. Description of the Related Art

Heretofore, the so-called chip mounter or the like fixing chips and the like to various substrates mounts the chips to a substrate after applying a soldering paste to the substrate, and then places the resulting chips-mounting substrate in a furnace to fix the chips to the substrate.

In this case, a dispenser pneumatically discharging the paste is known as a device applying the paste to the substrate.

Since, however, this kind of dispenser pneumatically discharges the paste, a flow control is very difficult when a discharge pressure is high, and in particular, the flow control is more difficult because of external disturbances such as lumps in a liquid, the quantity of the liquid in the dispenser, or a change in the viscosity of the liquid due to a temperature.

In addition, a pump which can discharge a liquid in a very small quantity and at a high accuracy for a solvent such as alcohol and an adhesive in addition to a soldering paste has been desired and a pump which can supply a liquid at a high speed has been desired in order to decrease workhours per step.

SUMMARY OF THE INVENTION

A primary object of the present invention is to provide a pump which can increase its discharge pressure and discharge even a high-viscous liquid such as a paste in a very small quantity at high accuracy at high speed.

In order to achieve this object, the present invention is a pump with a drawing passageway drawing a liquid and a discharge port discharging the liquid, characterized in that the pump comprises: a discharge port opening and shut valve opening and shutting the discharge port; a discharge element discharging the liquid; and a liquid drawing passageway opening and shut valve opening and shutting a liquid drawing passageway, each of these elements is arranged coaxially with one another inside to outside in the sequence of the discharge port opening and shut valve, discharge element and drawing passageway opening and shut valve, and a drive mechanism which drives the respective discharge port opening and shut valve, discharge element and drawing passageway opening and shut valve in their predetermined modes.

This drive mechanism is arranged so as to operate a drawing mode in which' the drawing passageway opening and shut valve is opened to move the discharge element away from the discharge port so as to draw the liquid, a measurement mode in which the drawing passageway opening and shut valve is closed after the drawing mode and measures the quantity of a liquid to be discharged, a discharge mode in which the discharge port opening and shut valve is opened after the measurement mode to move the discharge element to the discharge port so as to discharge the liquid, and a discharge port shut mode in which the discharge port opening and shut valve is closed after the discharge mode.

A second object of the present invention is to provide a pump having a more simplified liquid discharge stroke.

In order to achieve this object, the present invention is a pump with a drawing passageway drawing a liquid and a discharge port discharging the liquid, characterized in that the pump comprises: a discharge port and shut valve opening and shutting the discharge opening; a discharge element arranged outside and coaxially with the discharge port opening and shut valve and discharging the liquid; and a drawing passageway opening and shut valve arranged outside and coaxially with the discharge element and opening and shutting the liquid drawing passageway, further comprises a drive means arranged so as to operate a drawing mode in which the drawing passageway opening and shut valve is opened to move the discharge element away from the discharge port so as to draw the liquid, a measurement mode in which the drawing passageway opening and shut valve is closed after the drawing mode and measures the quantity of a liquid to be discharged, a discharge mode in which the discharge port opening and shut valve is opened after the measurement mode to move the discharge element to the discharge port so as to discharge the liquid, and a discharge completion mode in which the discharge port opening and shut valve is driven in association with a movement of the discharge element from a predetermined time before the completion of the discharge mode and closed at the moment when a discharge is completed.

DETAILED DESCRIPTION OF THE PREFERRED EMBODIMENT

Hereinafter, the embodiments of the present invention will be described with reference to the drawings.

Figure 1:
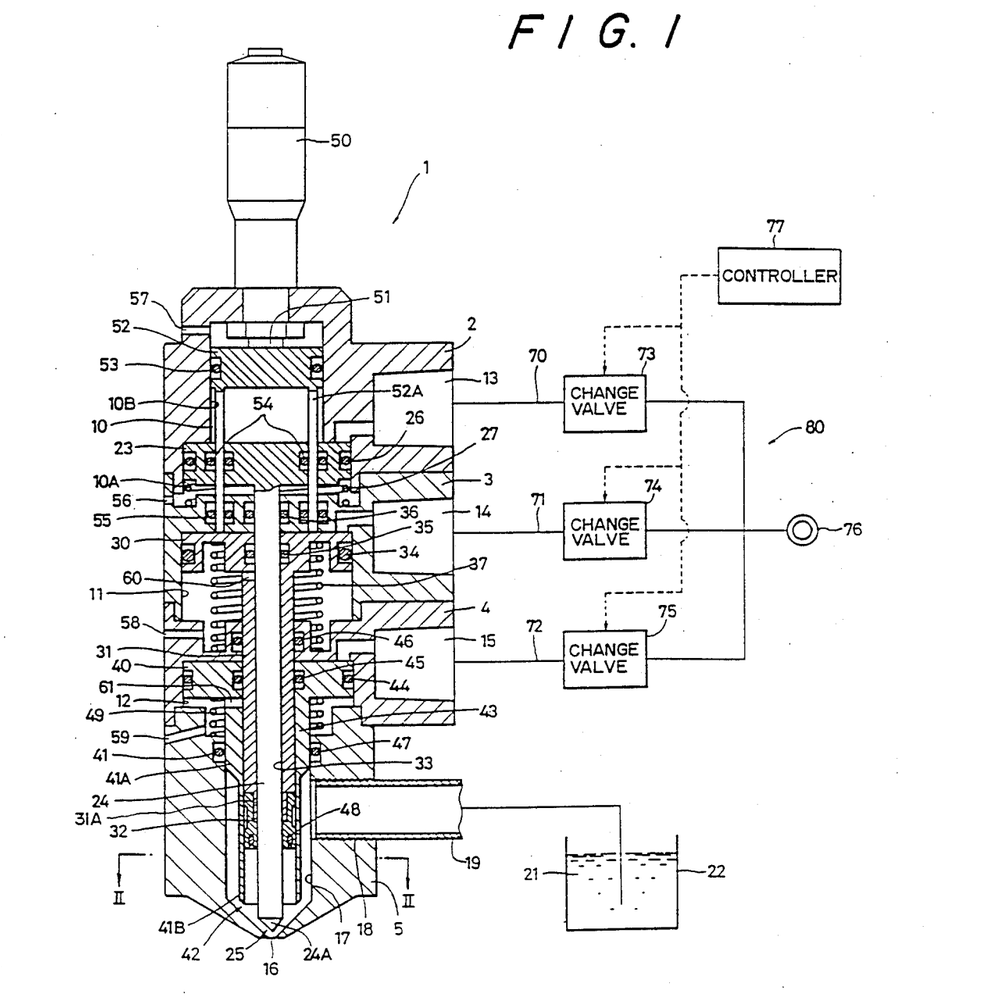
FIG. 1 is a sectional view through the overall arrangement of a first embodiment.
Figure 2:
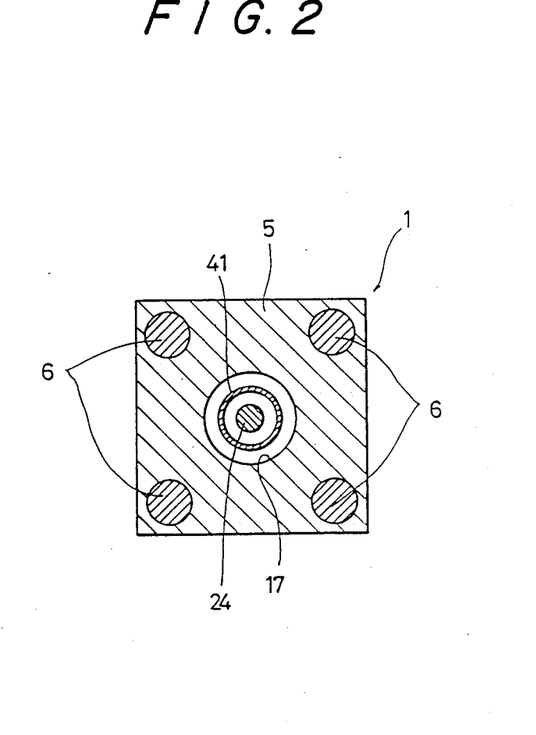
FIG. 2 is a sectional view taken along the line II—II in FIG. 1.

FIGS. 1 through 3 illustrate a first embodiment. As shown in FIG. 1 illustrating a section of a pump 1, the pump 1 is arranged so that four pump blocks 2, 3, 4 and 5 are connected in sequence vertically in FIG. 1. As shown in FIG. 2, connectors 6 each passing through four corners of the pump blocks 2-4 are used in order to connect the pump blocks 2-4.

The interior of the pump block 2 out of the above four pump blocks and provided at the top of the pump 1 defines a first cylinder 10 including a diametrically major portion 10A and a diametrically minor portion 10B which provide a diameter difference therebetween.

On the other hand, the respective interiors of the pump block 3 and pump block 4 adjoined to the pump block 3 define a second cylinder 11 and third cylinder 12.

The top surface of the diametrically major portion 10A of the first cylinder 10 and the top surfaces of the second cylinder 11 and third cylinder 12 respectively communicate with cylinder ports 13, 14 and 15 delivering compressed air to the respective cylinders 10, 11 and 12.

On the other hand, the pump block 5 provided at the bottom of the pump 1 defines a liquid drawing passageway 17 with a discharge port 16 tapering downwards and serving as a nozzle. A liquid introducing hole 18 extends from the liquid drawing passageway 17 to the side surface of the pump block 5. One end of a liquid feed pipe 19 is screwed to the liquid introducing hole 18. The liquid feed pipe 19 communicates with a tank 22 containing a liquid 21 e.g. soldering paste.

A first piston 23 is axially slidably mounted within the diametrically major portion 10A of the first cylinder 10 of the pump block 2. The first piston 23 has a first piston rod 24 extending out of the first cylinder to the liquid drawing passageway 17 through the pump block 3, second cylinder 11 and third cylinder 12 and having a circular cross-section as shown in FIG. 2.

The bottom end 24A of the first piston rod 24 is tapered and moves into contact with and away from the discharge port 16 to open and shut the discharge port 16. Thus, the bottom end 24A provides a discharge port opening and shut valve 25.

The slide surface of the first piston 23 has an O-ring 26 mounted thereon and is sealed so as not to leak compressed air fed into the first cylinder 10.

A coil spring 27 is seated between the first piston 23 and pump block 3 to urge the first piston 23 to the diametrically minor portion 10B of the first cylinder 10, i.e., upwards in FIG. 1.

A second piston 30 is axially slidably mounted within the second cylinder 11. The second piston 30 has a second-piston rod 31 extending out of the second cylinder 11 to the liquid drawing passageway 17 through the pump block 4 and third cylinder 12. A discharge element 32 made of Teflon (trade name) fits on the bottom end 31A of the second-piston rod 31.

The respective second piston 30, second-piston rod 31 and discharge element 32 have pipe forms together defining a through-hole 33 in the axes thereof. The first piston rod 24 is slidably mounted within the through-hole 33. Thus, the discharge element 32 is arranged outside and coaxially with the discharge port opening and shut valve 25.

The respective slide surfaces of the second piston 30, pump block 3 and first piston rod 24 are sealed by air leak preventing O-rings 32 and 35. Likewise, the respective slide surfaces of the pump block 3 and first piston rod 24 are sealed by an O-ring 36.

A coil spring 37 is seated between the second piston 30 and pump block 4 to urge the second piston 30 to the pump block 2.

A third piston 40 is axially slidably mounted within the third cylinder 12. The third piston 40 has a third piston-rod 41 extending out of the third cylinder 12 to the liquid drawing passageway 17.

The third piston-rod 41 includes a diametrically major portion 41A slidably mounted within the liquid drawing passageway 17 and a diametrically minor portion 41B having a smaller diameter than the diametrically major portion 41A, the two portions 41A and 41B being divided by a diameter difference defined essentially at the center of the axis of the third piston-rod 41. The bottom end of the diametrically minor portion 41B is tapered so as to make contact with the tapered face of the liquid drawing passageway 17 and moves into and out of contact with the tapered face of the liquid drawing passageway 17 to open and shut the liquid drawing passageway 17. Thus, the diametrically minor portion 41B of the third piston-rod 41 provides a drawing passageway opening and shut valve 42.

The third piston 40 and third piston-rod 41 have pipe forms together defining a through-hole 43 in the axes thereof. The second piston rod 31 is slidably mounted within the through-hole 43. Thus, the drawing passageway opening and shut valve 42 is arranged outside and coaxially with the discharge element 32.

Slide surfaces between the third piston 40, pump block 4 and slide surfaces between the third piston 40 and second piston rod 31 are sealed by respective O-rings 44 and 45. likewise, slide surfaces between the pump block 4 and second piston rod 31 are sealed by an O-ring 46.

An O-ring 47 preventing a leak of the liquid 21 fed into the liquid drawing passageway 17 is mounted between slide surfaces of the pump block 5 and diametrically major portion 41A of the third piston-rod 41. A spring 48 made of stainless steel is seated in a lower portion of the discharge element 32 to urge the discharge element 32 onto the first piston rod 24 and third piston-rod 41. Therefore, even when the first to third piston rods 24, 31 and 41 slidably move relative to each other, a clearance between the first piston rod 24 and second-piston rod 31 and a clearance between the second-piston rod 31 and third piston-rod 41 can be sealed so that the liquid 21 will not leak.

A coil spring 49 is seated between the third piston 40 and pump block 5 to urge the third piston 40 to the pump block 3.

A knob 50 and a spindle 51 movable forward and backward along the axis of the first cylinder 10 by means of rotations of the knob 50 are attached to the top of the pump block 2. The spindle 51 passes into the diametrically minor portion 10B of the first cylinder 10 and can vertically move a discharge amount adjuster 52 mounted within the diametrically minor portion 10B of the first cylinder 10.

The underside of the discharge amount adjuster 52 has adjusting rods 52A which pass through the first piston 23 and pump block 3 and can be in contact with the second piston 30.

Slide surfaces between the discharge amount adjuster 52 and pump block 2, slide surfaces between the adjusting rods 52A and first piston 23 and slide surfaces between the adjusting rods 52;. and pump block 3 are sealed by respective O-rings 53, 54 and 55.

Drain ports 56, 57, 58 and 59 communicating with the outside of the pump 1 are defined in the diametrically major portion 10A and minor portion 10B of the first cylinder 10, second cylinder 11 and third cylinder 12 so as to discharge out of the pump 1 even possible compressed air and liquid 21 which would have passed through sealed portions provided by the O-rings.

Drain ports 60 and 61 are defined in the second piston rod 31 and third piston-rod 41 and can discharge even possible compressed air and liquid 21 which would have leaked into spacings between the first piston rod 24 and second-piston rod 31 and between the second-piston rod 31 and third piston-rod 41.

The respective cylinder ports 13–15 are connected through pipings 70 , 71 and 72 to electromagnetic changeover or change valves 73, 74 and 75 which are connected to a pressure source 76 e.g. air compressor. The respective change valves 73–75 are independently controlled by a control device 77.

Thus, the respective cylinders 10-12, cylinder ports 13-15, first to third pistons 23, 30 and 40, first to third piston rods 24, 31 and 41, coil springs 27, 37 and 49, pipings 70-72, change valves 73-75, pressure source 76 and control device 77 constitute a drive mechanism 80 for the discharge port opening and shut valve 25, discharge element 32, and drawing passageway opening and shut valve 42.

The operation of the present invention will be described with reference to FIG. 3 illustrating the modes of operation.

Before the pump 1 starts i.e. when the pump 1 is in inoperative position, the bottom end 24A of the first piston rod 24 has moved to its lower limit and is in contact with the discharge port 16 to close the discharge port opening and shut valve 25. Compressed air is fed into the first cylinder 10 through the change valve 73 to close the discharge port opening and shut valve 25. On the other hand, the discharge element 32 and third piston-rod 41 are at their stroke ends, so that the drawing passageway opening and shut valve 42 is open.

At this time, the interior of the liquid drawing passageway 17 is receiving the liquid 21 fed from the tank 20.

Then, when the control device 77 controls the change valve 75 to change over so as to feed compressed air into the third cylinder 12, the third piston 40 moves downwards and responsive to this movement, the third piston-rod 41 is moved downwards to close the drawing passageway opening and shut valve 42, as shown in FIG.. 3(B). Thereby, the drawing passageway opening and shut valve 42 seals the liquid 21 therewithin, so as to regulate the liquid 21 to a predetermined amount.

Then, when the control device 77 changes over the change valve 73, the interior of the first cylinder 10 is opened to atmosphere, the coil spring 27 moves the first piston 23 upwards and this movement moves the piston rod 24 away from the discharge port 16. Thus, as shown in FIG. 3(C), the discharge port opening and shut valve 25 opens the discharge port 16, so that the liquid 21 can discharge.

Then, when the control device 77 changes over the change valve 74 to feed compressed air into the second cylinder 11, the discharge element 32 is moved downwards to discharge the liquid 21 contained within the drawing passageway opening and shut valve 42 from the discharge port 16.

Figure 3A:
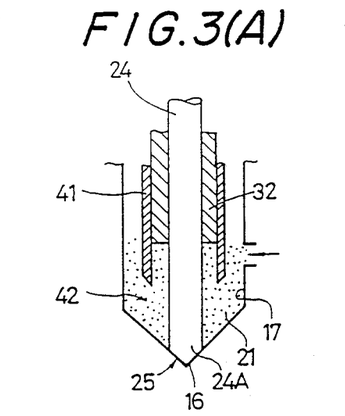
FIG. 3 is a diagram illustrating the modes of operation.
Figure 3B:
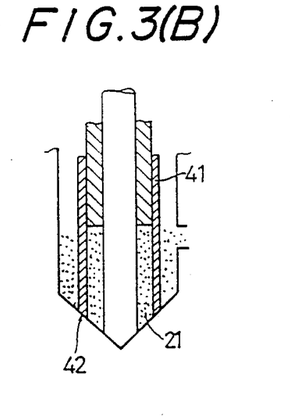
Figure 3C:
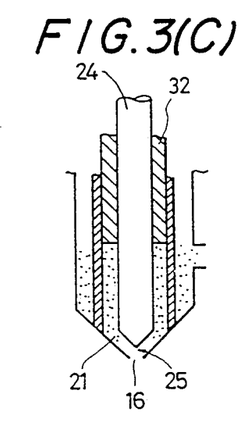
Figure 3D:
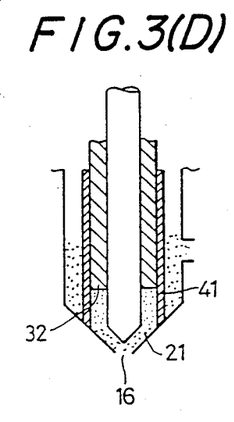
Figure 3E:
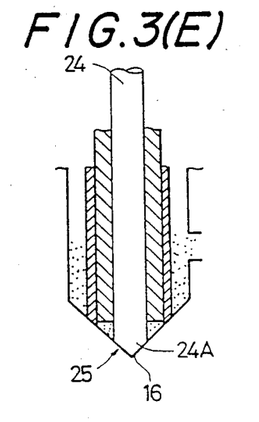

Then, when the change valve 73 is changed over to close the discharge port opening and shut valve 25, the discharge port 16 is shut as shown in FIG. 3(E). Since at this time, the bottom end 24A of the first piston rod 24 is brought into contact with the discharge port 16, the liquid 21 is sharply discharged.

Figure 3F:
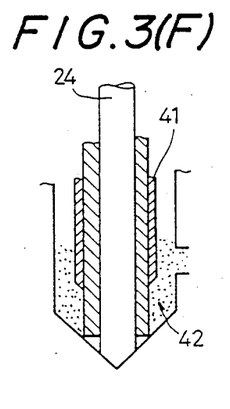

Then, when the change valve 75 is changed over to open the interior of the third cylinder 12 to atmosphere, the coil spring 49 moves the third piston 40 and third piston-rod 41 upwardly to open the drawing passageway opening and shut valve 42, as shown in FIG. 3(F).

Figure 3G:
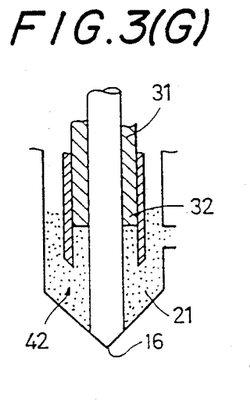

Then, when the change valve 74 is changed over to open the second cylinder 11 to atmosphere, the coil spring 37 moves the second piston 30 and second piston rod 31 upwards and also the discharge element 32 away from the discharge port 16, as shown in FIG. 3(G). At this time, the liquid 21 is fed into a spacing defined by the moving discharge element 32. After the state of FIG. 3(G), repeating the modes of operation of FIGS. 3(B)-(F) discharges a predetermined amount of the liquid 21 through the discharge port 16 at each sequence.

In addition, an amount of the liquid 1 drawn into a spacing of FIG. 3(B) defined in the drawing passageway opening and shut valve 42 minus an amount of the liquid 21 remaining in a spacing of FIG. 3(E), i.e. the so-called dead space, defined in the drawing passageway opening and shut valve 42 when the discharge port 16 is shut is a discharged amount. Thus, adjusting an amount of movement of the discharge element 32 i.e. an amount of movement of the second piston 30 by means of positioning the amount-of-movement adjuster 52 by means of the knob 50 causes to adjust the discharge amount.

The above-described present embodiment has the following advantages.

Since the amount of the discharge element 32 i.e. second piston 30 and closing the drawing passageway opening and shut valve 42 together regulate the volume of the liquid 21 confined in the drawing passageway opening and shut valve 42, the accuracy in even a very small quantity of the discharge amount can be high.

Since the discharge port opening and shut valve 25 is in contact with the tapered face of the discharge port 16 to shut the discharge port 16, cutting the liquid 21 can be sharp and the accuracy in the discharge amount can be higher.

While a high-viscous liquid 21 e.g. paste has caused a delay in discharging the liquid 21 when a pump section and a discharge opening are remote, the present embodiment will not cause a delay in discharging the liquid 21 because a pump section with the discharge element 32 discharging the liquid 1 and the discharge port 16 are very close to each other.

A solvent such as alcohol, which has a low boiling point and is readily vaporized, tends to produce bubbles when a flow is complicated e.g. the solvent is drawn into the pump or passes through a check valve and a possible stay of the bubbles may cause the liquid 21 not to be discharged. However, since according to the present embodiment, the pump section and the discharge port are very close to each other and a flow of the liquid 21 is not complicated, bubbles will not be produced and the liquid 21 can be normally discharged.

Since a kind of the liquid 21 may corrode a member of the pump 1, a liquid-contact portion of the pump 1 has required a need for an expensive material. However, since according to the present embodiment, the liquid-contact portion includes as few as the pump block 5, first piston rod 24, discharge element 32 and third piston-rod 41, a cost can be suppressed and the pump 1 can be provided at low price.

Since the drawing passageway opening and shut valve 42 is arranged outside and coaxially with the discharge port opening and shut valve 24, a drawing area allowing a liquid to be drawn through the liquid drawing passageway 17 into the drawing passageway opening and shut valve 42 can be increased and the time of drawing the liquid 21 i.e. a work time can be reduced.

Since the discharge element 32 is arranged between and coaxially with the discharge opening and shut valve 25 and the drawing passageway opening and shut valve 42, the above-described dead space can be reduced and work efficiency improved.

While a high-viscous liquid 21 must be extruded under a high pressure in order to be discharged at a high speed, a pressure-resistance of the pump 1 is increased because the respective pistons 23, 30 and 40, and piston rods 24, 31 and 41 are arranged coaxially with one another, so that the liquid 21 can be discharged at a high speed.

As described above, mere rotation of the knob 50 can readily adjust the discharge amount of the liquid 21.

Since the drive mechanism 80 is of the so-called air cylinder type, the size of the pump 1 can be reduced, so that the pump 1 is specially adapted to discharge a very small quantity of the liquid 21.

Since the drive mechanism 80 may control mere three change valves 73-75, the control is easy.

Since the 0-rings seal the respective slide surfaces, amounts of a leaking liquid 21 and compressed air can be very reduced and since the respective drain ports are provided, the pump 1 can exhaust thereoutside even the liquid 21 and compressed air which have leaked and mixing the liquid 21 with the compressed air can be prevented.

Since the pump 1 can discharge the liquid 21 from its upper portion remote from a mount e.g. substrate, a sensor e.g. for infrared radiation and provided outside the pump 1 can confirm a performance of the discharge.

Since the pump 1 has no check valve, the liquid 21 under pressure can be delivered. Therefore, even the high-viscous liquid 21 can be readily delivered into the pump 1.

While according to the above-described embodiment, the respective coil springs 27, 37 and 49 move the piston 23, 30 and 40 upwards as shown in FIG. 1, compressed air may alternatively move these pistons. In this case, a possible provision of four cylinder ports can perform the same modes of operation as described above.

While the state of FIG. 3(A) constitutes the rest i.e. base position of the pump 1, the state of FIG. 3(C) may alternatively constitute the rest i.e. base position of the pump 1 in response to a variety of the discharged liquid 21. In this case, since moving the first piston rod 24 produces negative pressure to draw the liquid 21 into the pump 1, there are advantages that the liquid 21 will not leak from the discharge port 16 and on the other hand, can be discharged at the moment when the pump 1 is driven. Selections of the base state controlled by the control device 77 are applicable to various kinds of the liquid 21.

Alternatively, an 0-ring or the like may fit on the discharge element 32 instead of the spring 48 made of stainless steel.

A second embodiment of the present invention will be hereinafter described with reference to FIG. 4. In the following description of the second embodiment, the same portion or a portion having the same function as a component portion of the above-described embodiment carries the same character and a description of the portion will be eliminated or abridged.

The second embodiment is characterized in that a descent of a discharge element 32 to its bottom completes a discharge of a liquid and concurrently shuts a discharge port 16 and thereby eliminating a need for the so-called two-stepped discharge.

Figure 4:
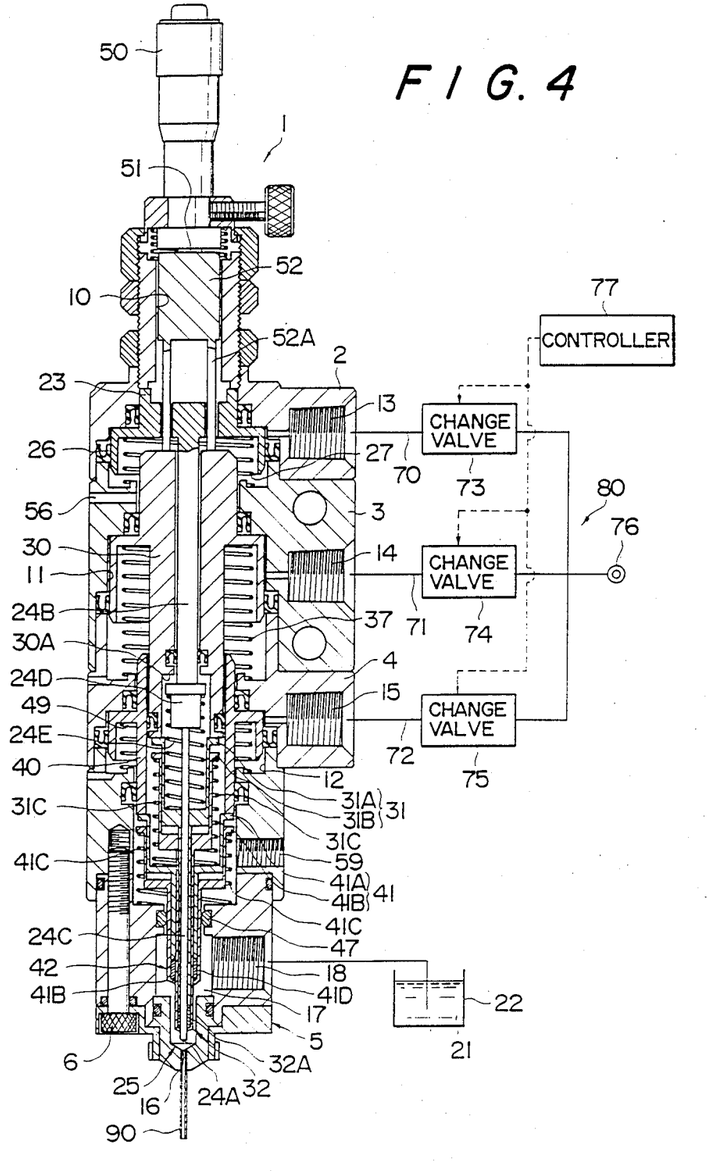
FIG. 4 is a sectional view through the overall arrangement of a second embodiment.

As shown in FIG. 4, a piston rod of the first piston 23 comprises a first piston-rod 24B and a second piston-rod 24C in alignment with the first piston-rod 24B. A coil spring 24E seated between a piston head 24D of a second piston-rod 24C and a second piston rod 31 as below-described normally urges the second piston-rod 24C to the first piston-rod 24B.

The second-piston rod 31 is so formed that the bottom end of the second piston 30 provided in a lower portion of the second piston 3C through a shoulder 30A depresses the second-piston rod 31. The second-piston rod 31 has a double-cylindrical form of an inner piston rod 31A and an outer piston rod 31B. A coil spring 31C is seated between the top end of the outer piston rod 31B and the third piston-rod 41, sc' that the second-piston rod 31 is urged upwardly in FIG. 4. A seal 32A made of Teflon or the like is seated between the above inner and outer piston rods 31A and 31B. The seal 32A is tightly retained between the inner and outer piston rods 31A and 31B by action of the above coil spring 24E and 31C. Thus, the inner and outer piston rods 31A and 31B and seal 32A constitute the discharge element 32.

The third piston-rod 41 is so arranged that the bottom end of the third piston-rod 41 and comprises an inner piston rod 41A and outer piston rod 41B together constituting a double-cylindrical form like the second-piston rod 31. The third piston-rod 41 is urged upwards in FIG. 4 by a coil spring 41C. A seal 41D made of Teflon or the like is seated between the bottom ends of the inner and outer piston rods 41A and 41B and tightly retained by the urging forces of the above coil springs 31C and 41C. The bottom end 41( of the third piston-rod 41 seats on a top opening in a retainer 91 for a nozzle 90 and is fitted into a pump block 5 when the third piston 40 descends. The bottom end 41B constitutes a drawing passageway opening and shut valve 42.

Other arrangements are essentially the same as those of the first embodiment.

Hereinafter, the operation of the second embodiment will be described with reference to FIGS. 5(A)-5(F) which diagrammatically illustrate for better understanding.

Figure 5A:
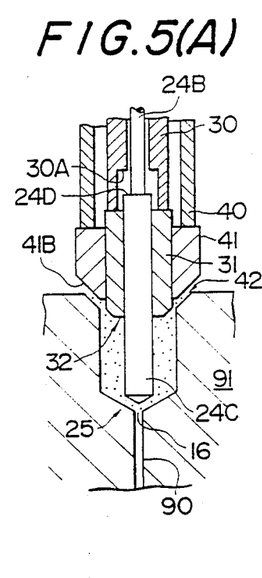
FIG. 5 is a diagram illustrating the modes of operation of the second embodiment.
Figure 5B:
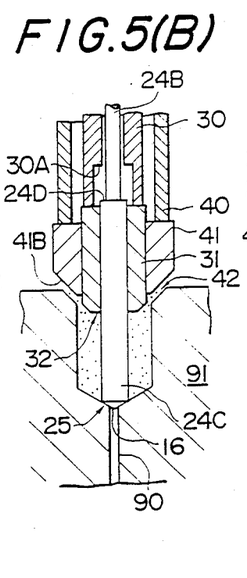
Figure 5C:
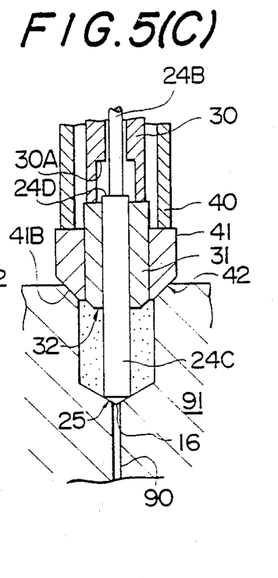

In an initial state of FIG. 5(A) in which air is not fed to respective cylinder ports 13-15, when air is fed to the cylinder port 13 as shown in FIG. 5(B), the first piston-rod 24B depresses the piston head 24D to descend the second piston-rod 24C to shut the discharge port 16. Until this time, the drawing passageway opening and shut valve 42 has been opened to draw the liquid 21. Then, air is fed through the cylinder port 15 and as the third piston 40 descends, the third piston-rod 41 closes the drawing passageway opening and shut valve 42 to shut up a predetermined amount of the liquid 21 in the retainer 91 (see FIG. 5(C)).

Figure 5D:
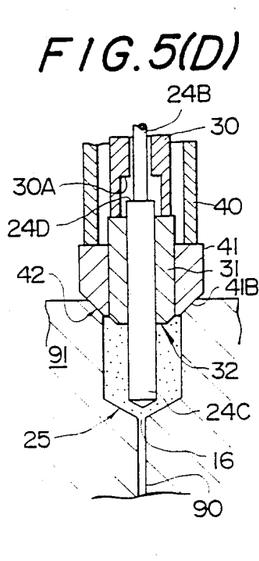
Figure 5E:
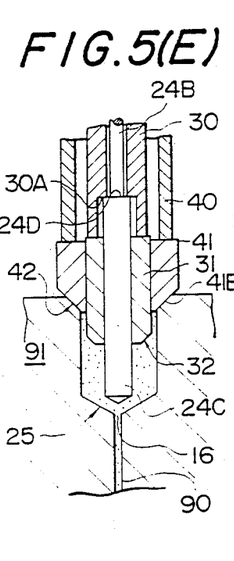
Figure 5F:
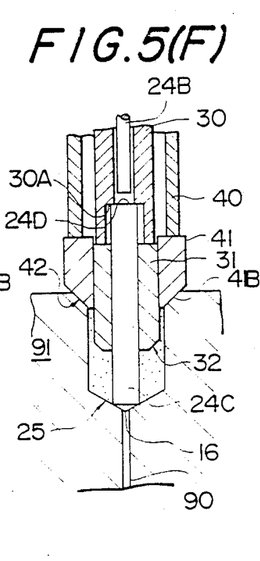

Then, when as shown in FIG. 5(D), the discharge port opening and shut valve 25 is opened as an air feed through the cylinder port 13 is stopped, air is fed through the cylinder port 14 and as the second piston 30 descends, the discharge element 32 descends, so that the nozzle 90 discharges the liquid 21 through the discharge port 16 (see FIG. 5(E)). Thus, in the last step of a discharge process, the shoulder 30A of the second piston 30 engages the head 24D of the second piston-rod 24C and the second piston-rod 24C descends together with the discharge element 32 and shuts the discharge opening 16 at the moment when the discharge is completed. Then, likewise discharge cycles are repeated.

Thus, the second embodiment produces the following advantages in addition to the advantages of the first embodiment.

That is, since immediately before the completion of the discharge carried out by the discharge element 32, the shoulder 30A of the second piston 30 engages the head 24D of the second piston-rod 24C and the second piston-rod 24C descends together with the discharge element 32 and shuts the discharge opening 16 at the moment when the discharge is completed, the two steps in which the discharge by the discharge element 32 is completed and then, the discharge port opening and shut valve 25 is closed are eliminated, so that the so called two-stepped discharge is eliminated and a single-stepped discharge can be carried out.

Therefore, even when a discharge amount is great and a quick-drying liquid is discharged, the two-stepped discharge of the liquid will not produce a double-stack of the discharged liquid, so that the discharged liquid will not be detached and an appearance of an object to which the discharged liquid is applied will not be impaired.

Since the respective second-piston rod 31 and third piston-rod 41 have double-cylindrical forms and the respective bottom ends thereof retain the seals 32A and 41D each made of Teflon by action of spring forces, the watertightness of the pump can be made excellent.

In the second embodiment, an arrangement of closing the discharge port opening and shut valve 25 at the moment when the discharge is completed need not be restricted to the above-described arrangement and an alternative arrangement can be employed.

For example, a cam may drive the respective pistons 23, 30 and 40 and the face of the cam may close the discharge port opening and shut valve 25 at the moment when the discharge element 32 completes its discharge, so that the single-stepped discharge is carried out.

Alternatively, other drive means, e.g., servomotors may directly drive the respective discharge port opening and shut valve 25, discharge element 32 and drawing passageway opening and shut valve 42. In consequence, a means for independently driving each of these elements which can perform the above-described modes of operation of the pump can be employed.

The arrangements of the discharge port opening and shut valve 25, discharge element 32 and drawing passageway opening and shut valve 42 will not be restricted to those of the embodiments and may differ. In consequence, the discharge port opening and shut valve 25, discharge element 32 and drawing passageway opening and shut valve 42 may be sequentially arranged coaxially with one another inside to outside. However, when these elements are arranged coaxially with one another according to the embodiments, advantages that pressureproofness is superior, the area for drawing a liquid can be increased etc. are obtained.

In addition, rubber Teflon and the like may be employed as a sealing material.

According to the present invention, the advantage is effected as described above that even a very small quantity of high-viscous liquid can be discharged at a high accuracy at a high speed.

What is claimed is:

1. A pump, comprising a pump body formed with a drawing passageway for drawing a liquid from a supply source and a discharge port means discharging the liquid, the pump body including:
   a first valve for opening and shutting the discharge port;
   an annular plunger arranged coaxially with said first valve for discharging the liquid through the discharge port;
   a second valve arranged coaxially with said annular plunger for opening and shutting the liquid drawing passageway;
   each said first valve, plunger and second valve having its own individual drive means so as to be separately movable from each other.

2. A pump as defined in claim 1, wherein each individual drive means is movable to attain the following controlled movements:
   opening of said second valve in a drawing mode and movement of said annular plunger away from the discharge port means so as to draw the liquid into the drawing passageway;
   closing of the discharge port means with the first valve in a sealing mode and after the drawing mode to seal a measured predetermined quantity of the liquid received in the drawing passageway in the drawing mode;
   opening of the discharge port means by movement of the first valve and moving the annular plunger to the discharge port means to discharge the liquid in a discharge mode;
   closure of the discharge port means by movement of the first valve following the discharge mode and in a discharge port shut mode.

3. A pump as defined in claim 1, wherein said individual drive means respectively includes pistons within said pump body, said first valve, said annular plunger and said second valve being driven by means of the movements of said pistons which are controlled independently of one another.

4. A pump as defined in claim 1, further including means for varying an amount of axial movement of said annular plunger so as to adjust a discharge amount of the liquid.

5. A pump, comprising a pump body formed with a drawing passageway for drawing a liquid from a supply source and a discharge port means discharging the liquid, the pump body including:
   a first valve for opening and shutting the discharge port;
   an annular plunger arranged coaxially with said first valve for discharging the liquid through the discharge port;
   a second valve arranged coaxially with said annular plunger for opening and shutting the liquid drawing passageway; and
   further comprising a drive means arranged so as to operate a drawing mode in which said second valve is opened to move said annular plunger away from the discharge port so as to draw the liquid into the passageway, a sealing mode in which said second valve is closed after the drawing mode to seal the measured liquid in a predetermined quantity, a discharge mode in which said first valve is opened after the sealing mode to move said annular plunger to the discharge port so as to discharge the liquid, and a discharge completion mode in which said first valve is driven in association with movement of said annular plunger to the discharge port and closed at the moment when said annular plunger is reached at the most advanced position toward the discharge port.

6. A pump as defined in claim 5, further including a piston for driving said annular plunger, wherein the first valve is arranged so as to engage a part of said piston at a predetermined time before said annular plunger reaches its most advanced position toward the discharge port, thereby moving together with said annular plunger.

* * * * *